United States Patent [19]

Ehnholm

[11] Patent Number: 5,144,238

[45] Date of Patent: Sep. 1, 1992

[54] MAGNETIC RESONANCE IMAGING APPARATUS

[75] Inventor: Gösta J. Ehnholm, Helsinki, Finland

[73] Assignee: Instrumentarium Corporation, Helsinki, Finland

[21] Appl. No.: 633,798

[22] Filed: Dec. 26, 1990

[30] Foreign Application Priority Data

Dec. 29, 1989 [GB] United Kingdom ............... 8929300

[51] Int. Cl.$^5$ ............................................. G01R 33/20
[52] U.S. Cl. .................................... 324/316; 324/309
[58] Field of Search ............. 324/300, 307, 309, 310, 324/311, 312, 313, 314, 316, 318, 322; 128/653 A, 653 SC

[56] References Cited

U.S. PATENT DOCUMENTS 4,984,573 11/1991 Leunbach ..................... 128/653.4
4,986,256 11/1991 Cohen et al. ................. 128/653.4
5,023,555  6/1991 Ehnolm ......................... 324/318

FOREIGN PATENT DOCUMENTS 8810419 12/1988 PCT Int'l Appl. .
9000904  2/1990 PCT Int'l Appl. .
2220269  1/1990 United Kingdom .

OTHER PUBLICATIONS

Bottomley, Rev. Sci Instrum 53:1319–1337 (1982).
Kean, "Magnetic Resonance Imaging—Principles and Applications", Heinemann, London 1986.
Koutcher, J. Nucl Med. 25:371–382 (1984).
Lurie, SMRM 8:329 (1989).
Lurie, J Mag Reson 84:431–437 (1989).
Steinberg, AJR 147:453–455 (1986).
Steiner, AJR 145:883–893 (1985).
Twieg, Med Phys 10:610–621 (1983).
Stepisnik, SMRM 7:1060 (1988).
House, IEEE Trans Nucl Sci NS-27:1220–1226 (1980).
Lauterbur, Nature 242:190–191 (1973).
Lurie, J Mag Reson 76: 360–370 (1988).
Mansfield, "NMR Imaging in Biomedicine", Supplement 2 to Advances in Magnetic Resonance, Academic Press, New York, 1982.

Primary Examiner—Michael J. Tokar
Attorney, Agent, or Firm—Chilton, Alix & Van Kirk

[57] ABSTRACT

There is provided an electron spin resonance enhanced magnetic resonance imaging (ESREMRI) apparatus having means arranged to generate a primary magnetic field of a first value during periods of nuclear spin transition excitation and magnetic resonance signal detection for the generation of ESREMRI images of a subject and means arranged to generate a primary magnetic field of a second and higher value during periods of nuclear spin transition excitation and magnetic resonance signal detection for the generation of native MR images of a subject, and preferably also means for combining, e.g. superimposing, ESREMRI and native MR images so generated.

14 Claims, No Drawings

MAGNETIC RESONANCE IMAGING APPARATUS

The present invention relates to improvements in and relating to methods of magnetic resonance imaging, in particular electron spin resonance enhanced magnetic resonance imaging, and to apparatus therefor.

Magnetic resonance imaging (MRI) is a non-invasive imaging technique which is achieving progressively wider acceptance by physicians for use in medical diagnoses. The technique was developed by Lauterbur who published the first magnetic resonance (MR) images in 1973. By 1985, at least 500 MR imagers had been installed for clinical use around the world (see for example Lauterbur, Nature 242:190-191 (1973), Steinberg, A. J. R. 147:453-454 (1986) and Steiner, A. J. R. 145:883-893 (1985)).

MR images are generated by manipulation of the MR signals detected from a sample, for example a human or animal body, placed in a magnetic field and exposed to pulses of radiation, typically radio frequency (RF) radiation, of a frequency selected to excite MR transitions in selected non-zero spin nuclei (the "imaging nuclei") in the sample.

In order to encode spatial information into the MR signals during the imaging procedure, the magnetic field experienced by the sample is modified by the imposition onto a uniform primary magnetic field $\underline{B}_o$ of magnetic field gradients. Thus, for example, since the resonating frequency of an imaging nucleus is dependent on the strength of the magnetic field ($\underline{B}$) in which it lies as well of course as on factors such as the chemical environment and the isotopic nature of the nucleus (which may for example be $^1H$, $^{13}C$, $^{19}F$), by imposing a field gradient in the z direction on the sample during periods during which the sample is exposed to pulses of the MR transition exciting radiation, the position and width in the z direction of the slice through the sample in the xy plane from which the MR signals are emitted is defined by the strength of the primary field $\underline{B}_o$, the applied field gradient $d\underline{B}/dz$, and the frequency and bandwidth of the exciting pulses.

Subsequent imposition of further field gradients in the period between the initial pulse of the MR transition exciting radiation and the period during which the MR signal is detected and also during that period of detection can similarly encode x and y spatial information into the MR signal.

There are several different encoding techniques known in the art, but all rely upon the imposition onto the primary field of field gradients of different magnitudes and/or in different directions, in particular sequences within the MR-transition-excitation/MR-signal-detection cycles.

Moreover, using different pulse and detection sequences, for example spin echo, spin inversion, spin recovery, etc., different types of MR images can be generated from the detected signals, for example images in which the pixel intensity is proportional to the density of the imaging nuclei in the corresponding volume element of the sample (e.g. proton density images), $T_1$ and $T_2$ images.

For a general discussion of the principles of MRI, the reader is referred to the articles by Bottomley, Rev. Sci. Instrum. 53:1319-1337 (1982), Hinshaw et al., Proc. IEEE 71: 338-350 (1983), House IEEE Trans. Nucl. Sci. NS-27: 1220-1226 (1980), Koutcher et al. J. Nucl. Med. 25: 371-382 (1984), Mansfield et al. in "Advances in Magnetic Resonance" edited by Waugh, Academic Press, New York (1982), Twieg, Med. Phys. 10:610-621 (1983) and Kean et al. "Magnetic Resonance Imaging", Heinemann, London (1986).

In a MR imager, the primary magnetic field $\underline{B}_o$ is conventionally generated by a superconducting magnet, a resistive magnet or a permanent magnet. The choice of the primary magnetic field strength used in MRI affects the quality and characteristics of the images that can be generated and also affects the image acquisition time and the manufacturing and running costs of the MR imager. Thus, for example, for a given image acquisition procedure, the use of higher strength primary fields results in improved signal to noise (SN) ratios. As a result, the best MR images that have so far been obtained have been produced using the large primary magnetic fields that can be generated by superconducting magnets. This is because such magnets give very strong, stable and homogeneous fields while at the same time providing some shielding against external perturbing magnetic fields. The disadvantages, however, are that such magnets are very expensive and are very difficult to service and maintain and also that it is now recognized that there are dangers associated with the use of high fields.

At lower fields, for example 2000 gauss (0.2 T), resistive magnets may be used, and at fields of 200 gauss (0.02 T) or less such magnets are quite inexpensive and simple to operate and install. At low fields, however, technical problems arise, in particular the poor SN ratio which results from the low MR signal amplitude and frequency.

This technical problem has been addressed in a variety of ways. Thus, for example Hafslund Nycomed in WO-A-88/10419 and Lurie et al. in J. Magn. Reson. 76:360-370 (1988) have described the use of dynamic polarization, produced by stimulation of coupled ESR transitions to increase MR signal strength, and Stepisnik et al. in Society of Magnetic Resonance in Medicine, Seventh Annual Meeting, 20-26 Aug. 1988, page 1060, have suggested that polarization may be enhanced by pulsing the imaging nuclei with a higher magnetic field prior to detection of the MR signals. It is also possible to increase the SN ratio by decreasing the noise of the MR signal detector, the RF receiver coil, by cooling it with liquid nitrogen and/or by making it of a superconductive material.

Using the dynamic polarization effect, in Electron spin resonance enhanced magnetic resonance imaging (ESREMRI) the MR signal strength is enhanced by a factor (E) the absolute magnitude of which is dependent on several factors but which can in practice be as high as a hundred or more.

In ESREMRI a paramagnetic material (a "contrast agent") serves as the source for the ESR transitions and is generally introduced into the subject being imaged, for example a human or non-human, e.g. mammalian, body or an inanimate sample before imaging takes place. The subject is irradiated with a first radiation of a frequency and amplitude selected to excite some or all of the ESR transitions of the contrast agent (this is generally of MW frequency or thereabouts and so for simplicity such radiation is referred to hereinafter as the MW radiation). For the generation of the MR image the subject will be exposed to a second radiation of a frequency selected to excite nuclear spin transitions in the imaging nuclei (this is generally of RF frequency or thereabouts and so for simplicity such radiation is referred to hereinafter as the RF radiation). The pulsing and timing of the RF radiation and the imposition of magnetic field gradients so as to yield MR signals from which the ESR enhanced MR images may be generated may, as described in WO-A-88/10419, be as in conventional MRI.

The end result is an enhanced MR image which shows volumes of the subject which contain the contrast agent amplified in signal strength by the factor E which could theoretically be as high as 330.

ESREMRI thus has the advantage that the image SN ratio can be greatly improved. Good images can therefore be made at comparatively low values of the primary magnetic field. Another advantage is that the images show the parts of the sample containing the contrast agent very much more strongly than those parts which do not contain the contrast agent. This is particularly advantageous for flow dynamic studies in a sample or patient.

ESREMRI however has its limitations. One clearly is the tendency of the MW radiation to heat the subject. Thus for a subject of fixed size and shape and for a given imaged volume, the power absorbed by the subject, $P_a$, is proportional to the squares of the amplitude $A_m$ and frequency $F_m$ of the MW radiation. Thus $$P_a = k_o \cdot F_m^2 \cdot A_m^2 \cdot D_m \qquad (1)$$

where $k_o$ is a constant and $D_m$ is the duty cycle of the MW radiation, i.e. the relative proportion of the total imaging time for which the subject is exposed to the MW radiation. The duty cycle is included in equation (1) since MW heating can be limited by applying the MW radiation in short pulses. $P_a$ is thus effectively a tissue averaged MW power absorption value. This kind of averaging can be made over a time length of 0.1 h according to ANSI C95.1-1982 safety levels. This power absorption has to be small enough so that the specific absorption rate (SAR) does not exceed safe limits. (Definitions and recommended upper levels for the SAR are given by different national boards, e.g. in the USA by the Federal Drug Administation).

Another problem or limitation of ESREMRI has to do with the "native" image, i.e the unenhanced image, for example the image of those parts of the subject which do not contain the contrast agent. To avoid excessive heating, a fairly low value should be selected for the frequency $F_m$ of the MW radiation and this automatically limits the magnetic field $B_e$ for which the electrons resonate at frequency $F_m$ as $F_m$ is proportional to $B_e$. By pulsing the MW radiation as explained, thus making $D_m$ smaller, higher values of $F_m$ can be tolerated, but still only up to some practical limit. From equation (1) it can be seen that this limit is strongly affected by $A_m$, the MW amplitude needed for adequate stimulation or saturation of the ESR line. Known paramagnetic substances, for instance nitroxide stable free radicals, require quite high $A_m$ values in terms of heat input. Even with improved contrast agents, for example deuterated stable free radicals as discussed by Hafslund Nycomed in WO-A-90/00904, it seems clear that heating will continue to have to be considered.

The fact that avoidance of undue MW heating requires relatively low magnetic fields ($B_e$) to be used means that nuclear polarization, which is proportional to field strength, is reduced and consequently MR signal strength and image quality are also reduced. ESREMRI images are still good because of the large MR signal enhancement; however the quality of the native images problematic and for practical clinical applications it is very desirable to be able to obtain good native MRI images also, as otherwise interpretation of the ESREMRI images, which "highlight" contrast agent containing regions, can be hindered.

The prior art suggests two methods by which ESREMRI and adequate native MR images might be generated without moving the subject from an ESREMRI imager to a conventional MRI imager—a procedure which would not permit immediate generation of exactly superimposable ESREMRI and native MR images. Both these methods involve rapid cycling of the primary magnetic field between one value at which nuclear spin transitions are stimulated by the RF radiation and the MR signals are detected and a second value at which in one method nuclear polarization is effected and in the other method MW irradiation is effected.

In the first such method, the procedure of Stepisnik et al. (supra) is employed and the primary magnetic field is rapidly cycled between a high value $B_p$ for a nuclear polarization period lasting for a time of the order of $T_{1p}$, the imaging nuclei's spin-lattice relaxation time, and a low value $B_o$, for an imaging period in which the excitation-detection cycle of ESREMRI or native MR image generation is effected. In the polarization period the imaging nuclei are given a suitably high degree of polarization which is carried over into the imaging period by rapid cycling of the primary field from $B_p$ to $B_o$ within a period much shorter than $T_{2p}$, the imaging nuclei's spin-spin relaxation time. In this way a value of $B_o$ sufficiently low for MW heating to be tolerable could be selected while still achieving sufficient nuclear polarization for the native MR images to be adequate.

In the second method, the procedure of Sepponen (see Finnish patent application No. 883153) or of Lurie et al. (see J. Mag. Reson. 84:431 (1989) and Society of Magnetic Resonance in Medicine, 8th Annual Meeting, page 329) is used and the primary magnetic field is rapidly cycled between a low value $B_e$ for an ESR saturation period lasting for a time of the order of $T_{1p}$ during which the subject is exposed to relatively low frequency MW radiation to achieve dynamic nuclear polarization of the imaging nuclei with relatively low MW heating occurring and a high value, $B_o$, for an imaging period in which the excitation-detection cycle of MR image generation is effected. By selecting a sufficiently high value of $B_o$, a native MR image of adequate quality can be generated.

Both these methods however have a severe drawback insofar as they require rapid cycling of the primary field and it has now been recognized that the problem is solved more efficiently by providing ESREMRI apparatus with means for generating a primary magnetic field of a first value during ESREMRI nuclear spin transition excitation-resonance signal detection periods and means for generating a primary magnetic field of a second and higher value during nuclear spin transition excitation-resonance signal detection periods for the generation of native MR images.

Thus viewed from one aspect the invention provides an ESREMRI apparatus having means arranged to generate a primary magnetic field of a first value during periods of nuclear spin transition excitation and magnetic resonance signal detection for the generation of ESREMRI images of a subject and means arranged to generate a primary magnetic field of a second and higher value during periods of nuclear spin transition excitation and magnetic resonance signal detection for the generation of native MR images of a subject, and preferably also with means for combining, e.g. superimposing, ESREMRI and native MR images so generated.

Viewed from a further aspect, the invention also provides a method of generating a magnetic resonance image of a subject said method comprising generating an ESREMRI image of at least part of said subject from magnetic resonance signals detected during the imposition on said subject of a primary magnetic field of a first value and generating a native MR image of at least part of said subject from magnetic resonance signals detected during the imposition on said subject of a primary magnetic field of a second and higher value, and preferably also generating a combined image by combination, e.g. superposition, of said ESREMRI and native MR images.

To ensure any MW heating effect is minimized, the apparatus of the invention is preferably provided with means for cycling the primary field between its first and second values, e.g. at a frequency such that the MW exposure of the subject is kept beneath 2 W/kg bodyweight for any 6 minute time period. Such cycling means may conveniently be provided by a computer arranged to control the operation of the imaging apparatus as a whole. Preferably cycling will be effected rapidly with the changeover taking for example 1 to 60 seconds. Particularly preferably cycling will be so effected that the period of imposition of the primary field at its first value, the ESREMRI period, will be of sufficient duration to enable at least one ESREMRI image to be generated while the period at the second value may be sufficient only to detect a portion of the signal data set necessary for generation of a native image. In this way a time varying ESREMRI image sequence may be set against a native image which is time averaged for the same overall time period. Thus for the method of the invention it will be particularly preferred to use a so-called fast imaging technique, e.g. a SNAPSHOT technique, for the ESREMRI imaging.

In the apparatus and method of the invention, rapid cycling procedures akin to those of Stepisnik et al. (supra) and/or Sepponen (supra) may of course also be employed. However, for reasons set out more fully below this generally will not be done. Nonetheless if it is, then for the generation of the ESREMRI image the primary field may be cycled between a third value for the esr excitation period and the first value for the imaging period, the third value being lower than the first value. Additionally or alternatively, for the generation of the native MR image the primary field may be cycled between a fourth value for the polarization period and the second value for the imaging period, the fourth value in this case being larger than the second value. Thus the apparatus may if desired be provided with means arranged to generate primary magnetic fields of said third and/or said fourth values.

The apparatus of the invention should of course be provided with the various components necessary for generation of ESREMRI or native MR images. It may for example comprise structural components as illustrated in the drawings of WO-A-88/10419 which are accordingly incorporated herein by reference. Thus it will conveniently comprise magnetic field gradient imposing means, MW and RF radiation imposing means, RF radiation detecting means and means for generating images from the detected MR signals, generally a computer which conveniently will also operate to control the operation of the various field generation and radiation generation/detection means. Such components are of course conventional and on the whole require little description here.

The apparatus of the invention is conveniently provided with unitary or separate means for exciting and/or detecting said magnetic resonance signals for the generation of said enhanced and said native magnetic resonance images.

It should however be noted that, in a preferred embodiment, the apparatus of the invention may be provided with means for generating MW radiation capable of simultaneously stimulating more than one esr transition in the contrast agent, e.g. a broad band emitter or, more preferably, means for emitting MW radiation of two or more frequency bands.

It will be appreciated that the means for generating the various primary magnetic fields may be the same or different components of the apparatus. Similarly the means for imposing and detecting the RF radiation for ESREMRI image generation and for native MR image generation may be the same or different.

It will also be appreciated that as the diagnostician may not need or wish to see the individual ESREMRI or native MR images and may consider the combined image to meet his needs, the images generated by the method of the invention need not be in tangible visualizable form but may instead simply take the form of data sets which could be manipulable to form a tangible image and which conveniently are stored in a computer memory or other data storage means.

In one preferred embodiment of the apparatus of the invention, the coil(s) used for detection of the magnetic resonance signals (the free induction decay signals), and optionally also for transmission to the subject of the nuclear spin transition exciting radiation (the RF radiation), are the same for both ESREMRI and native MR image generation. In this event the apparatus will be provided with means for returning the RF coils between ESREMRI and native MR imaging periods or alternatively wideband coils, which would not require returning, may be used. In an alternative also preferred embodiment, the apparatus of the invention is provided with two interchangeable RF coils (or coil sets) the first arranged for operation in the ESREMRI imaging periods and the second arranged for operation in the native MR imaging periods. The two coils or coil sets may be interchanged for example by providing each with its own set of mechanical guides so that it can be moved into or out of operating position as appropriate.

In either event the apparatus of the invention may thus be switched from an ESREMRI image generation mode to a native MR image generation mode without moving the subject, in particular preserving the subject's position relative to the magnetic field gradient imposing coils.

Selection of the preferred magnitude for the first value of the primary field strength (that during ESREMRI imaging periods) will generally represent a compromise, especially where esr excitation is effected using the same primary field. The figure should thus be as high as possible within the safety limits set by MW heating taking into account that the MW radiation amplitude should be high enough in the region being imaged as to excite the esr transition(s) sufficiently to achieve acceptable SN ratio enhancement, e.g. to saturate the transition(s) to the point where enhancement becomes less than proportional to MW amplitude, and also taking into account the preference that, for practical considerations, the MW duty cycle should preferably not exceed 20%; particularly preferably the duty cycle is up to 10%, especially 5-10%, more particularly about 5%.

In contrast, within the limits imposed by economy and other practical constraints, the second value of the primary field strength (that during native MR imaging periods) will preferably be selected to be as high as possible. Where RF coils have to be returned between ESREMRI and native MR imaging periods, the magnitude of the second value will be limited by the constraints on returning to much higher frequencies due to stray capacitances of the coils or other similar physical phenomena.

Where, as mentioned above, esr excitation is performed at a low (third) primary field value rapidly cycled with an intermediate (first) primary field value for the ESREMRI imaging periods with native MR image generation being effected at a high (second) primary field value, on the one hand it is possible by careful selection of the first (intermediate) field level to keep within manageable limits the power level and eddy current problems that are inherent with rapid cycling and on the other hand a good RF coil efficiency can be obtained at the first field value and the problems associated with coil returning will be lowered due to the smaller difference between the first and second field values. The cycling power can in this way be comparable to that used in generation of the native MR image.

The present invention thus provides a method and apparatus using which, without altering the position of the imaged subject, ESREMRI and native MR images of the same regions can be generated and can immediately be exactly superimposed to facilitate interpretation.

The advantage of the apparatus of the invention may be seen particularly clearly when the disadvantages of the procedures which rely entirely on rapid cycling are considered and are particularly clear demonstrated by the computed figure of merit (FOM) for image quality enhancement which is discussed below.

The disadvantage of relying entirely on rapid cycling of the primary field is well illustrated by this example: The lowest field strength in presently available commercial MR imagers which produce images that can be considered as acceptable native MR images is 0.04 T. The magnet consumes 104 A at 115 V, the power is 12 kW. To pulse this magnet between fields of for example, $B_e=0.01$ T and $B_o=0.04$ T in 10 milliseconds a voltage of 500 V is needed in order to overcome the effect of the inductance (0.06 Henry). The peak power for the supply then increases to 64 kW. In addition the supply has to be bipolar. To produce a supply that can perform rapid switching at these high power levels and simultaneously keep the needed stability to within less than one part per million immediately after switching would be expensive and complicated.

Rapid cycling is also complicated by eddy current effects which occur both near and far from the imaging volume. Copper and aluminium pieces with a minimum dimension of a few centimeters or more perpendicular to the magnetic field will have induced eddy currents with time constants from 10 milliseconds up. This means that the MR imager will be as vulnerable to any metal object in this size range as present systems are to ferromagnetic objects. This is because an object which is totally diamagnetic (with its inside screened by eddy currents) gives the same field perturbation as a strongly ferromagnetic object of the same size and shape, albeit time dependent and with the opposite sign. Careful design of the magnet, avoiding strip conductor in windings and including a ferromagnetic cover made of finely divided iron to avoid eddy currents would help in theory. In practice this kind of cover is expensive and difficult to construct so as not to have eddy currents itself.

Rapid field cycling thus does not on its own seem to provide the solution to generating adequate native MR and ESREMRI images at safe MW heating levels. This is further illustrated by the computations mentioned above.

As the FOM is chosen the inverse of the total time needed for forming an image of some specific quality assuming that the quality is affected by the signal-to-noise ratio and total time spent on collecting data (This takes into account the effect of averaging multiple data sets). The FOM can thus be written as $$FOM = k_2 (SN)^2 Dce \qquad (2)$$

where $K_2$ is a constant, SN is the signal to noise ratio and Dce, the data collection efficiency, is the fraction of the total imaging time spent on actually collecting useful image data. In addition the condition of equation (1) above must be met. Since two field strengths are being used, this can be rewritten as $$P_a = k_1 B_e^2 A_m^2 D_m \qquad (3)$$

Since $F_m$ is proportional to $B_e$, the field used during esr excitation, $k_o F_m^2$ is replaced by $k_1 B_e^2$ where $k_1$ is a further constant.

SN is dependent on various different design parameters. In Magn. Resonance in Medicine 3: 604 (1986), Edelstein et al. analyse the factors affecting SN and divide them into intrinsic and spurious.

The intrinsic factors are on one hand the primary field strength values used during both the polarization and imaging periods and on the other hand the unavoidable noise from the subject, e.g. from the patient's tissue. The spurious factors comprise the noise from losses in the RF coil, the surrounding magnet structure and so on, i.e. factors which in principle can be avoided by improvements in design. The intrinsic component of SN is thus proportional to $B_o$. Spurious noise from the RF coil and other sources can be included by a factor which will be called coil efficiency, Ce. It is defined as the loss of signal power in the subject divided by the total signal power loss; this means that SN is proportional to the square root of Ce.

One must also take into account that the imaging nuclei polarization in a measurement that includes dynamic polarization and field cycling is proportional not to $B_o$ as in the cited publication, but to $E \cdot B_e$ which thus takes the place of $B_o$ in the equation. SN can now be written $$SN = k_3 E \cdot B_e \cdot \sqrt{Ce} \qquad (4)$$

where E is a function of $A_m$ and Ce of $B_o$. (In a system not employing cycled primary fields $B_o = B_e$).

Inserting SN into equation (2) gives $$FOM = k_4 E^2 B_e^2 Ce Dce \qquad (5)$$

where the constant $k_4 = k_1 k_3^2$.

Within the allowed heating limits as defined in equation (3) it is of course desirable to optimize FOM and this is in the first place done by optimizing $E(A_m)$. A theoretical expression for $E(A_m)$ is known but it is based on the assumption that the imaging nuclei relax towards the latice solely through interaction with the paramagnetic spin of the contrast agent. In practical situations this assumption breaks down. Theory shows that $E(A_m)$ is an S-shaped curve saturating to some value below $E=330$ and that its rate of growth at the steepest part approaches that of $A_m^2$. In practice one can of course measure $E(A_m)$ and use the measured curve for the optimization.

One further equation which connects the timing parameters $D_m$ and $D_{ce}$ to each other can also be derived. Thus in a typical imaging sequence each MR signal is collected for a time of approximately $T_{2p}$. If the repetition time between signal acquisitions is $T_{rep}$, then $$D_{ce} = T_{2p}/T_{rep} \qquad (6)$$

On the other hand the esr excitation is effected before each signal acquisition period for a time of approximately $T_{1p}$. Thus $$D_m \simeq T_{1p}/T_{rep} \qquad (7)$$

and so $D_{ce}$ can be approximated as $$D_{ce} = D_m T_{2p}/T_{1p} \qquad (8)$$

Using this, FOM becomes $$FOM = k_4 E^2 B_e^2 D_m C_e T_{2p}/T_{1p} \qquad (9)$$

or, using equation (3) for $B_e^2 D_m$:

$$FOM = k_5 (E^2/A_m^2) C_e \qquad (10)$$

where the constant $k_5 = k_4 T_{2p} P_a / k_1 T_{1p}$

From this equation one can make the following conclusions:

(A) FOM depends on $B_e$ and $D_m$ only through $(E/A_m)^2$. One should thus first optimize $(E/A_m)^2$ and subsequently pick a combination of $B_e$ and $D_m$ that satisfies the requirements of equation (3). This is of course directed by criteria which are not contained within the FOM.

(B) $B_o$ enters FOM only through $C_e$.

The choice of parameters can now be made in the following way:

First, $B_e$ is selected to be sufficiently low that $D_m$ does not become too small. A very small $D_m$ means that the MW radiation has to supplied as bursts with large amplitude and long intervals. This taxes the MW amplifer and limits the choice of suitable pulse sequences. The $D_m$ should preferably be larger than about 0.1.

Second, $B_o$ is selected. Unless rapid field cycling is used (which for the reasons discussed above it generally is not) $B_o$ equals $B_e$.

There is no simple formula for the dependence of the coil efficiency $C_e$ on $B_o$. Measurements on realistic coils in the field range of interest generally about 5–50 mT, show that the Q-value of the unloaded RF coil can, using litz wire and careful design, be kept between 2500 and 3000. It can be shown that $C_e$ is given by $$\begin{aligned} C_e &= \text{(patient loss)/(total loss)} \\ &= \text{(patient loss)/(patient loss + coil loss)} \end{aligned} \qquad (11)$$

One can write coil loss $\alpha$ $1/Q$ unloaded $\qquad (12)$
patient loss $\alpha$ $1/Q$ loaded $- 1/Q$ unloaded $\qquad (13)$
which gives $$C_e = 1 - \frac{Q \text{ loaded}}{Q \text{ unloaded}} \qquad (14)$$

This shows how to measure $C_e$ experimentally. For a head coil with enough space inside for microwave antenna measured values for $C_e$ were 0.24 at $B_o = 10$ mT and 0.61 at 40 mT.

These equations and measurements for $C_e$ are all based on ambient temperature coils. By cooling the coils with liquid nitrogen the noise of the coils can be further reduced and $C_e$ values of around 0.8 can then be obtained.

These calculations, backed up by measurements, have thus shown that when doing ESREMRI, assuming that the contrast agent used is such that MW heating will limit the amplitude of allowed MW power, then the figure-of-merit, which determines the inverse time needed to obtain an image with a specified quality (as limited by the SN ratio) depends on the field strength used only through the coil efficiency $C_e$. The dependence is not very strong and if the coil is cooled with liquid air or liquid nitrogen $C_e$ can be brought close to its maximum value, one.

Depending on the properties of the contrast agent used, the primary fields for ESREMRI will thus by choice be $B_e = B_o = 5$–20 mT. At substantially lower fields (e.g. below 2 mT), the polarization becomes successively lower so that the MR signal becomes weak even when amplified by the effects of dynamic nuclear polarization. At fields above 20 mT the increase in the ESR resonance frequency makes it progressively more difficult to make the MW radiation penetrate into a patient's body. Also the tolerable duty cycle $D_m$ rapidly decreases which makes it difficult to design good pulse sequences.

Such preferred field values for ESREMRI are, however, too low for generation of good quality native MR images and this drawback is overcome using the present invention.

I claim:

1. An electron spin resonance enhanced magnetic resonance imaging apparatus having means arranged to generate a primary magnetic field of a first value during periods of nuclear spin transition excitation and magnetic resonance signal detection for the generation of electron spin resonance enhanced magnetic resonance images of a subject and means arranged to generate a primary magnetic field of a second and higher value during periods of nuclear spin transition excitation and magnetic resonance signal detection for the generation of native magnetic resonance images of said subject.

2. Apparatus as claimed in claim 1 further comprising means for combining said enhanced and native images.

3. Apparatus as claimed in claim 1 further provided with means for cycling between generation of said primary field at said first and second values.

4. Apparatus as claimed in claim 3 wherein said means for cycling are arranged to effect changeover between said values of said primary field in 1-60 seconds.

5. Apparatus as claimed in claim 3 wherein said means for cycling are so arranged that during image generation said primary field is at said first value for up to 20% of the time.

6. Apparatus as claimed in claim 3 wherein said means for cycling are so arranged that said primary field is at said first value for periods sufficient to generate at least one said enhanced image and at said second value for periods sufficient to generate a detected magnetic resonance signal data set which in combination with at least one further said data set is sufficient to enable generation of a said native range.

7. Apparatus as claimed in claim 1 arranged to generate said enhanced images using a fast imaging technique.

8. Apparatus as claimed in claim 1 having means arranged for exciting and/or detecting said magnetic resonance signals for the generation of both of said enhanced and said native magnetic resonance images.

9. Apparatus as claimed in claim 1 having means arranged for exciting and/or detecting said magnetic resonance signals for the generation of said enhanced magnetic resonance image and further means arranged for exciting and/or detecting said magnetic resonance signals for the generation of said native magnetic resonance image.

10. A method of generating a magnetic resonance image of a subject said method comprising generating an electron spin resonance enhanced magnetic resonance image of at least part of said subject from magnetic resonance signals detected during the imposition on said subject of a primary magnetic field of a first value and generating a native magnetic resonance image of at least part of said subject from magnetic resonance signals detected during the imposition on said subject of a primary magnetic field of a second and higher value.

11. A method as claimed in claim 10 further comprising generating a combined image of said subject by combination of said enhanced and native images.

12. A method as claimed in claim 10 wherein during the period said subject is exposed to said primary field the exposure of said subject to electron spin resonance transition stimulating radiation serving to enhance magnetic resonance signals is no more than 2 W/kg subject weight in any 6 minute time span.

13. A method of generating a magnetic resonance image of a subject said method comprising generating an enhanced magnetic resonance signal data set sufficient for the generation of an electron spin resonance enhanced magnetic resonance image of at least part of said subject from magnetic resonance signals detected during the imposition on said subject of a primary magnetic field of a first value, generating a native magnetic resonance signal data set sufficient for the generation of a native magnetic resonance image of at least part of said subject from magnetic resonance signals detected during the imposition on said subject of a primary magnetic field of a second and higher value, generating from both said data sets a combined image of at least part of said subject.

14. A method as claimed in claim 13 wherein during the period said subject is exposed to said primary field the exposure of said subject to electron spin resonance transition stimulating radiation serving to enhance magnetic resonance signals is no more than 2 W/kg subject weight in any 6 minute time span.

* * * * *